United States Patent
Kennedy et al.

(10) Patent No.: US 6,272,741 B1
(45) Date of Patent: Aug. 14, 2001

(54) HYBRID SOLDER BALL AND PIN GRID ARRAY CIRCUIT BOARD INTERCONNECT SYSTEM AND METHOD

(75) Inventors: Craig M. Kennedy, San Marcos, CA (US); Julian Curtis Hart, Round Rock, TX (US); Fernando J. Ramirez, Fountain Valley, CA (US)

(73) Assignees: Autosplice, Inc., San Diego, CA (US); Xetel Corp., Austin, TX (US)

( * ) Notice: Subject to any disclaimer, the term of this patent is extended or adjusted under 35 U.S.C. 154(b) by 0 days.

(21) Appl. No.: 09/122,225

(22) Filed: Jul. 24, 1998

(51) Int. Cl.$^7$ ...................................... H05K 3/36
(52) U.S. Cl. ..................... 29/830; 174/260; 174/267; 29/843
(58) Field of Search ............... 29/830, 840, 842, 29/843; 361/736, 803, 791; 219/85.1, 85.2, 85.21, 85.22; 228/180.1, 180.21, 180.22; 174/260, 267; 439/75, 78

(56) References Cited

U.S. PATENT DOCUMENTS

| | | | |
|---|---|---|---|
| 4,462,534 | * 7/1984 | Bitaillou et al. | 228/180 A |
| 4,592,137 | * 6/1986 | Tanaka et al. | 29/843 |
| 5,145,104 | * 9/1992 | Apap et al. | 228/179 |
| 5,261,155 | * 11/1993 | Angulas et al. | 29/830 |
| 5,561,594 | * 10/1996 | Wakefield | 361/760 |
| 5,562,462 | * 10/1996 | Matsuba et al. | 439/70 |
| 5,641,945 | * 6/1997 | Abe et al. | 174/261 |
| 5,669,774 | * 9/1997 | Grabbe | 439/70 |
| 5,716,222 | 2/1998 | Murphy | 4/58 |
| 5,800,184 | * 9/1998 | Lopergolg et al. | 439/66 |
| 5,887,344 | * 3/1999 | Sinclair | 29/843 |
| 5,932,891 | * 8/1999 | Higashi et al. | 257/48 |
| 5,955,888 | * 9/1999 | Frederickson et al. | 324/761 |
| 6,007,348 | * 12/1999 | Murphy | 439/70 |
| 6,010,060 | * 1/2000 | Sarkhel et al. | 228/179.1 |
| 6,024,584 | * 2/2000 | Lemke et al. | 439/83 |

OTHER PUBLICATIONS

IBM Technical Disclosure bulletin, Jan. 1, 1974, vol. 16, issue 8, p. 2597 (author unknown).*

* cited by examiner

Primary Examiner—Jeffrey Gaffin
Assistant Examiner—Jeremy Norris
(74) Attorney, Agent, or Firm—Michael H. Jester

(57) ABSTRACT

A circuit board interconnect system includes a carrier board with a hybrid solder ball and pin grid array. A plurality of electrically conductive pins extend through the carrier board and are arranged in rows and columns to form a grid array. A first circuit board such as a multi-chip module (MCM) board has a plurality of conductive pads or traces formed on a lower surface thereof that are arranged to form a complementary grid array, i.e. the spacing and location of the conductive pads or traces corresponds to the spacing and location of the pins. A plurality of solder balls are provided with each ball being positioned on top of a corresponding pin so that each solder ball forms a solder connection between a pin and a corresponding conductive pad or trace. A second circuit board such as a computer mother board has a pin connector mounted on an upper surface thereof for individually receiving and providing electrical connection with each of the pins. After reflow, the solder balls wrap around the side walls of the heads of the pins and the side walls of the pads. The resulting generally spherical solder connections are therefore much stronger than conventional elongated fillet connections.

23 Claims, 3 Drawing Sheets

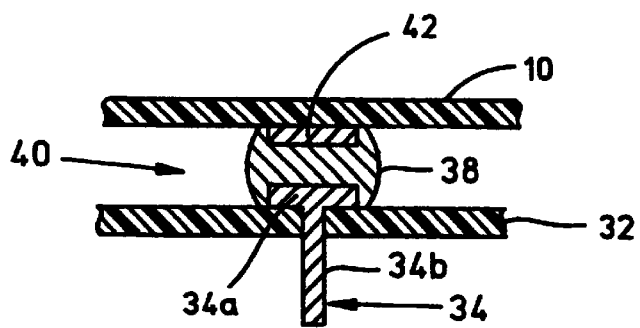
FIG. 5
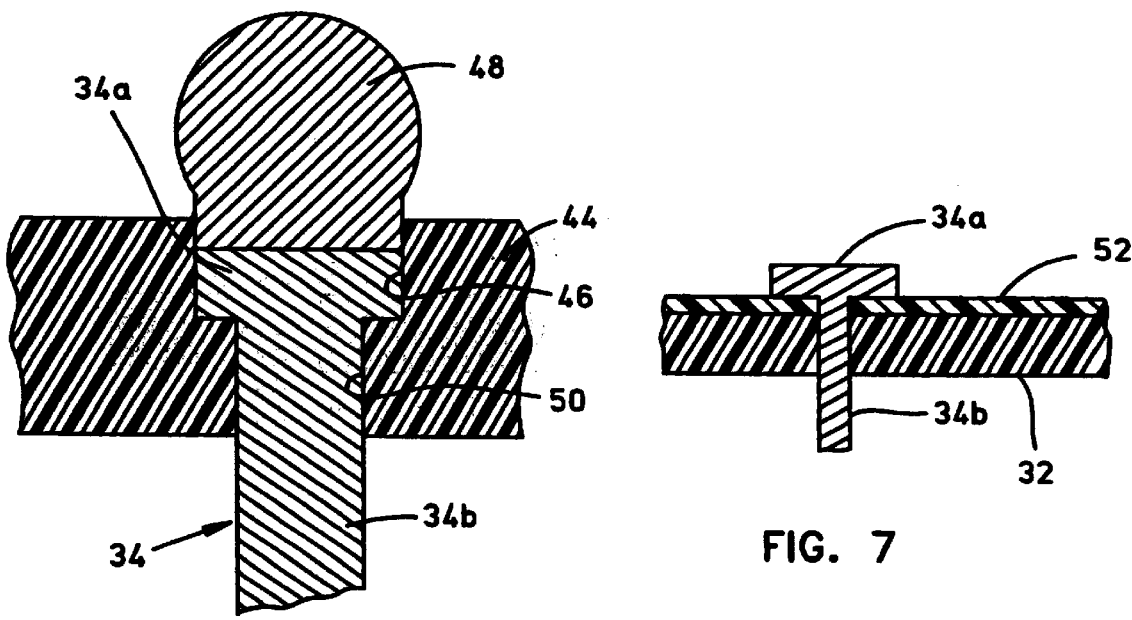
FIG. 6
FIG. 7
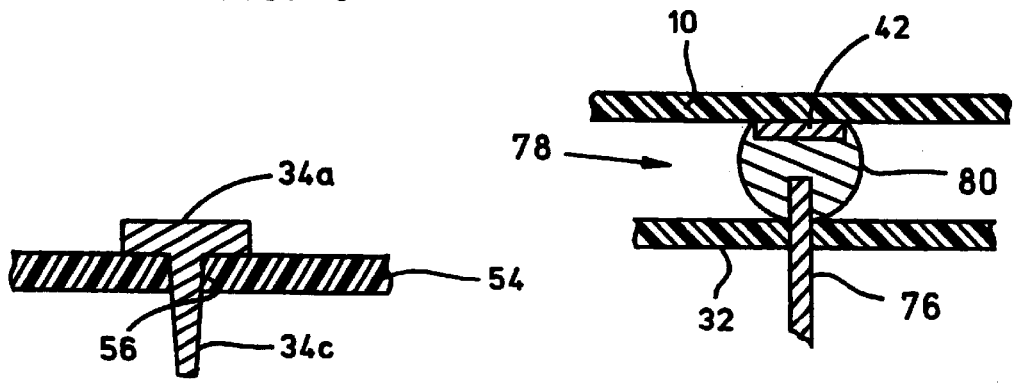
FIG. 8
FIG. 10

HYBRID SOLDER BALL AND PIN GRID ARRAY CIRCUIT BOARD INTERCONNECT SYSTEM AND METHOD

BACKGROUND OF THE INVENTION

The present invention relates to interconnect devices used in electronic assemblies, and more particularly, to pin grid arrays used to connect a large number of contacts from one circuit to another circuit.

Microelectronic circuits such as microprocessors are frequently packaged so that their large number of electrical contacts can be accessed via a pin grid array (PGA). The pin grid array comprises rows and columns of tiny conductive pins that extend generally perpendicular from the planar underside of a thin rectangular housing. It is not uncommon to have well over two hundred pins in a pin grid array. The housing of the microprocessor is made of ceramic or plastic and encases an integrated circuit chip. Microscopic wire leads electrically connect the upper ends of the pins to individual contacts on the chip. The pins may be plugged into corresponding receptacles in a socket connector mounted on a circuit board. The pin grid array has the advantage of providing a reliable mechanical and electrical interconnection between the microprocessor and the circuit board, while at the same time allowing the microprocessor to be removed for repair or replacement. For example, a mother circuit board for a personal computer may have a microprocessor with a pin grid array that can be unplugged so that an enhanced microprocessor, e.g. one having a math coprocessor, can be installed in its place.

An alternative to the pin grid array is the ball grid array. It comprises rows and columns of tiny solder balls attached to the underside of a microprocessor. These solder balls register with corresponding conductive pads or traces on the circuit board. Mechanical and electrical connection is achieved by subjecting the board and microprocessor to infrared or convective heating to achieve solder reflow. While this is a reliable method for surface mounting microelectronic components on a circuit board, the components cannot be easily removed for repair or replacement. However, it is a less expensive approach than the pin grid array since the cost of pins and socket connectors is eliminated.

Pin grid arrays have also been used on separate carrier boards to interconnect a large number of electrical contacts on a first circuit board to a second circuit board. FIG. 1 is an exploded diagrammatic view illustrating a prior art technique widely used in the personal computer industry to connect a first plurality of electrical contacts on the underside of a multi-chip module (MCM) board 10 to a second plurality of corresponding electrical contacts on computer mother board 12. A carrier board 14 is provided that has a plurality of pins 16 that extend through the carrier board. The pins 16 are arranged in a grid array and their upper ends are soldered to corresponding pads or traces on the underside of the MCM board 10. The lower ends of the pins 16 can then be plugged into a socket connector 17 attached to the upper side of the mother board 12. The socket connector 17 provides a means that can be mounted on, or directly to, the mother board 12 for individually receiving and providing electrical connection with the pins 16. The prior art pin grid array interconnect arrangement of FIG. 1 allows computer manufacturers to make a common mother board that can be utilized to make a variety of different computer configurations. It also allows computer users to easily upgrade their systems, e.g. to run more efficiently and at higher speeds, by simply plugging a suitable MCM 10 into the mother board 12.

The prior art circuit board interconnection technique illustrated in FIG. 1, while serviceable, has reliability problems. FIG. 2 illustrates a greatly enlarged vertical cross-sectional view of a so-called "butt joint" solder connection 18 between the upper end of one of the pins 16 and a conductive pad 20 on the underside of the MCM board 10. A pattern of solder is typically screened onto the conductive pads 20 on the MCM board.

When this solder undergoes reflow, a fillet 22 of solder is formed around the upper end of the pin 16. However, the fillet 22 is only slightly larger than the radial width of the pin 16. In addition, the solder joint 24 between the upper end of the pin 16 and the conductive pad 20 is relatively narrow in vertical height. The result is a delicate mechanical interconnection between the pin 16 and the conductive pad 20. It is often necessary to straighten one or more pins 16 in the grid array on the carrier board 12. This can lead to fractures through the corresponding fillet 22 and joint 24, resulting in intermittent electrical contacts or open circuits that impair proper operation of the associated circuits. The MCM board 10 and mother board 12 are typically made of FR-4 material, a laminate of fiberglass, epoxy and etched copper circuit traces. The carrier board 14 is typically made of a high temperature thermoplastic. The differences in the coefficients of thermal expansion of the different materials can stress the solder connections between the upper ends of the pins 16 and the conductive pads 20 on the underside of the MCM board 10, leading to fractures through the fillet 22 and joint 24, resulting in intermittent electrical contacts or open circuits. Lateral loads on the MCM board 10, such as pushing by the user, can also break one or more of the solder connections between the pins 16 and the MCM board 10.

Reliability problems with the prior art circuit board interconnection technique illustrated in FIG. 1 are compounded if there is any substantial departure from true coplanarity between the MCM board 10 and the grid array of pins 16. FIG. 3 illustrates a greatly enlarged vertical cross-sectional view of an alternate defective solder connection 26 between the upper end of one of the pins 16' and the conductive pad 20' on the underside of the MCM board 10. The solder connection 26 occurs when lack of true co-planarity between the MCM board 10 and the carrier board 12 places the upper end of the pin 16' too far away from its corresponding conductive pad 20'. An excessively elongated fillet 22' of solder is formed around the upper end of the pin 16'.

In addition, the solder joint 24' between the upper end of the pin 16' and the conductive pad 20 has been excessively elongated. The result is an even more delicate mechanical interconnection between the pin 16' and the conductive pad 20.

It would therefore be desirable to provide an improved pin grid array interconnect system and method that would overcome the above-noted deficiencies of the prior art technique illustrated in FIGS. 1–3.

SUMMARY OF THE INVENTION

It is therefore the primary object of the present invention to provide an improved inexpensive electronic interconnect system that can reliably connect a plurality of electrically and/or thermally conductive metal contacts such as pins inserted in a carrier substrate to a corresponding plurality of electrically and/or thermally conductive metal contacts such as conductive pads or traces formed on a circuit substrate.

It is a further object of the present invention to provide an improved system for connecting a plurality of pins inserted in a carrier board to form a first pattern to corresponding conductive pads or traces formed on a circuit board and arranged in a second complementary pattern.

It is another object of the present invention to provide an improved system for interconnecting a multi-chip-module board to a computer mother board via a carrier board.

It is another object of the present invention to provide a method for more reliably connecting an array of pins on a carrier board to corresponding array of conductive pads or traces on a circuit board utilizing solder balls, thereby avoiding weak solder fillet connections that often fracture due to lack of co-planarity of the boards and/or differential thermal expansion there between.

In accordance with one embodiment of the present invention an electronic interconnect system comprises a carrier board connected between first and second circuit substrates. A plurality of electrically and/or thermally conductive metal contacts are attached to the carrier board and are arranged in a first pattern. The first circuit substrate has a plurality of conductive elements formed on an underside thereof that are arranged to form a second pattern complementary to the first pattern, i.e. the spacing and location of the conductive elements on the first circuit substrate corresponds to the spacing and location of the conductive metal contacts on the carrier board. A plurality of solder balls are each positioned on top of a corresponding conductive metal contact so that each solder ball forms a solder connection between a conductive metal contact and a corresponding conductive element. A second circuit substrate has a connector mounted on an upperside thereof for individually receiving and providing electrical connection with the conductive metal contacts.

The present invention also provides a method of electrically and mechanically interconnecting a large number of contacts on a first circuit board with a corresponding number contacts on a second circuit board. In accordance with a preferred embodiment of the method the first step involves forming a carrier board. Next a plurality of holes are formed through the carrier board, the holes being arranged in a predetermined pattern. A plurality of electrically conductive pins are then inserted through the holes in the carrier board to form a first grid array. A plurality of conductive pads or traces are formed on a surface of a first circuit board for providing a second grid array complementary to the first grid array, there being one pad or trace corresponding to each of the pins. The spacing and location of the conductive pads or traces corresponds to the spacing and location of the pins. According to the next step of the preferred embodiment of our method a plurality of solder balls are placed onto a first set of ends of the pins, there being one solder ball on top of each pin. Next the solder balls are placed in contact with corresponding ones of the conductive pads or traces. The solder balls are then melted so that they bond to the first set of ends of the pins to the conductive pads or traces. Each solder ball forms solder connection between the first end of a corresponding pin and one of the conductive pads or traces. A connector, such as a socket type connector, is mounted on a surface of a second circuit board for individually receiving and providing electrical connection with the pins. Finally, a second set of ends of the pins are plugged into the electrical connector mounted on the second circuit board.

A key aspect of the preferred embodiment of our invention is that after reflow, the solder balls wrap around the side walls of the heads of the pins and the side walls of the conductive pads. The resulting generally spherical solder connections are therefore stronger than conventional elongated fillet connections.

BRIEF DESCRIPTION OF THE DRAWINGS

FIG. 5 is a greatly enlarged vertical cross-sectional view of a solder connection between the upper end of one of the pins of the hybrid solder ball and pin grid array interconnect system of FIG. 1 and a conductive pad on the underside of the multi-chip module board.

FIG. 6 is a diagrammatic vertical sectional view of an alternate embodiment of our hybrid solder ball and pin grid array interconnect system in which the upper side of the carrier board is formed with counterbored holes.

FIG. 7 is a diagrammatic cross-sectional view of a coating of a material on the upper side of the carrier board used to inhibit the flow of molten solder along the shaft of the pin.

FIG. 8 is a diagrammatic view of an alternate approach to inhibiting the flow of molten solder under the head of the pin 34a and through the hole 50 in the carrier board 54.

FIG. 10 is a view similar to FIG. 5 illustrating an alternate embodiment that utilizes headless pins, instead of pins with heads.

DESCRIPTION OF THE PREFERRED EMBODIMENTS

Throughout the following description, reference is made to circuit boards. It will be readily understood by those of ordinary skill in the art that our invention is applicable not only to circuit boards in the traditional sense, such as FR-4 epoxy laminate and thermoplastic boards with discrete electronic components mounted thereon, but also to ceramic and other substrates and interconnections between individual components and circuit boards, and to interconnections between two different substrates having circuits formed thereon. The term "substrate" as used herein is broader than the term "circuit board" and includes any structural member made of dielectric or insulative material, with or without conductive pads, traces, lines, conductors and so forth.

Figure 4:
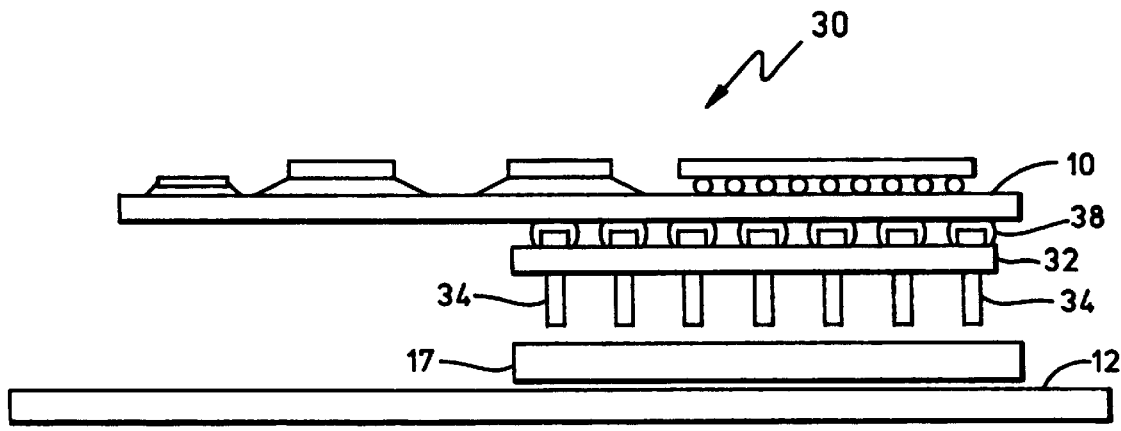
FIG. 4 is an exploded diagrammatic side elevation view illustrating a hybrid solder ball and pin grid array interconnect system in accordance with our invention being utilized to connect a multi-chip module board to a computer mother board.

FIG. 4 is an exploded diagrammatic side elevation view illustrating a hybrid solder ball and pin grid array electronic interconnect system 30 in accordance with our invention being utilized to connect a first circuit substrate in the form of the multi-chip module (MCM) board 10 to a second circuit substrate in the form of the computer mother board 12. A carrier board 32 is made of the same material as the board 10 and is provided with a plurality of electrically and thermally conductive metal contacts in the form of pins 34 that extend through the carrier board 32. The pins 34 are arranged in a grid array made up of equally spaced rows and columns. The heads 34a at the upper ends of the pins 34 are soldered via previously affixed solder balls 38 to conductive means hereafter described formed on the underside of the MCM board 10. Besides a grid array of rows and columns, the pins 34 could be arranged in a wide variety of other patterns.

As shown in FIG. 4, the lower ends of the pins 34 are plugged into the socket connector 17 attached to the mother board 12. The connector socket 17 thus provides a means for individually connecting the lower ends of the pins 34 to the circuit on the mother board 12. The pins 34 are made of metal, such as phosphor bronze, so that they will be electrically conductive. By way of example, the shaft diameter of the pins 34 may be 0.018 inches. Instead of pins 34, a wide variety of other electrically and/or thermally conductive metal contacts may be utilized, depending upon the particular requirements of the electronic interconnect system.

FIG. 5 is a greatly enlarged vertical cross-sectional view of a solder connection 40 between the head 34a of one of the pins 34 of the solder ball and pin grid array electronic interconnect system 30 of FIG. 4 and a conductive pad 42 on the underside of the MCM board 10. By way of example, the conductive pads 42 may be made of Copper and may have a round shape, a rectangular shape, a diamond shape, and oval shape or any other shape suitable for solder attachment via the melted and re-solidified solder ball 38. Each solder ball 38 is preferably soldered to the head 34a of a pin 34 as later described. The conductive pads 42 are arranged in a grid array of rows and columns that is complementary to the grid array of pins 34. It will be understood that the patterns in which the pins 34 and conductive pads 42 are arranged can be widely varied. The patterns of the pins 34 and conductive pads 42 should be complementary, at least to the extent required to make the necessary number of connections between the pins 34 and the correspondingly located conductive pads 42.

Referring still to FIG. 5, the pin head 34a is preferably mounted flush with the upper surface of the carrier board 32. The shaft 34b of each pin extends snugly through a corresponding hole punched, drilled or otherwise formed through the carrier board 32. After each pin head 34a with a solder ball previously attached thereto is placed in contact with a conductive pad 42 on the underside of the MCM board 10 the solder balls are heated above their melting temperature by conventional means such as infrared or convective heating. Each solder ball physically bonds to a corresponding conductive pad 42 on the underside of the MCM 10 when it is melted. The solder connection 40 is formed when the solder balls 38 are allowed to cool and solidify.

When each solder ball 38 is melted, it flows around the vertical cylindrical exterior surface of its corresponding pin head 34a and the vertical side walls of its corresponding non-solder-masked conductive pad 42 as illustrated in FIG. 5. Each solder ball 38 also adheres to the top horizontal circular surface of the pin head 34a as well has the horizontal lower surface of the conductive pad 42 between its vertical side walls. The resulting generally spherical solder connection 40 is much stronger than the elongated fillet connections 18 (FIG. 2) and 26 (FIG. 3) which result from the prior art technique.

The final shape of the somewhat flattened solder ball 38 is illustrated in FIG. 5. The re-solidified solder ball 38 has a cross-section resembling the pin that holds together the links of a bicycle chain. In three dimensions the re-solidified solder ball 38 of the solder connection 40 has a center disk-shaped portion with an upper flange and a lower flange. The solder ball 38 of the solder connection 40 has two depressions formed in opposite sides thereof, one for the pin head 34a and the other for the solder pad 42.

The conductive pads 42 provide a plurality of conductive means mounted on the bottom surface of the MCM board 10 that are arranged to form a grid array, there being one conductive means corresponding to each of the pins 34. The spacing and location of the conductive pads 42 corresponds to the spacing and location of the pins 34. Other conductive means formed on the underside of the MCM board 10 such as traces of etched copper substrate, screened solder paste, pressed in conductors and the like may also serve as the conductive elements to which the solder balls 38 are soldered.

Figure 1:
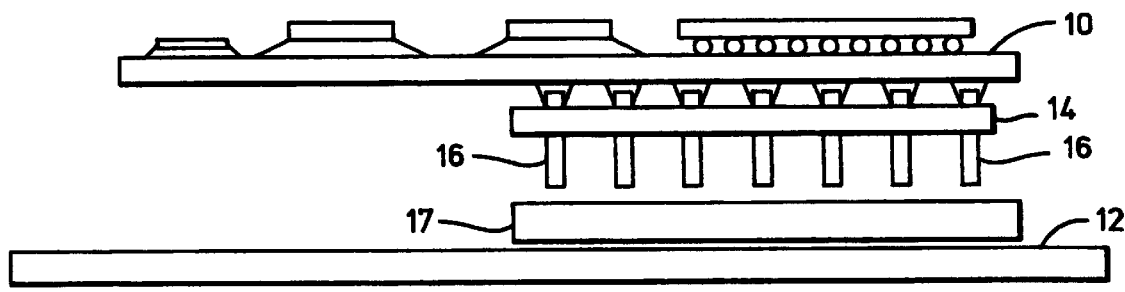
FIG. 1 is an exploded diagrammatic side elevation view illustrating the prior art pin grid array technique widely used to connect a multi-hip module board to a computer mother board.
Figure 2:
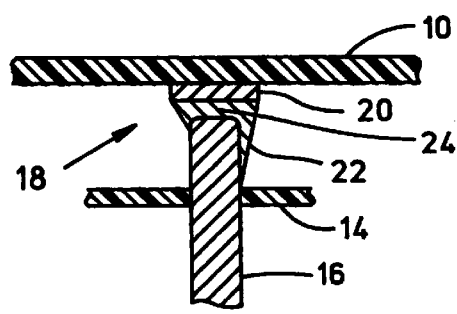
FIG. 2 is a greatly enlarged vertical cross-sectional view of the butt joint solder connection between the upper end of one of the pins of the pin grid array of FIG. 1 and a conductive pad on the underside of the multi-chip module board.
Figure 3:
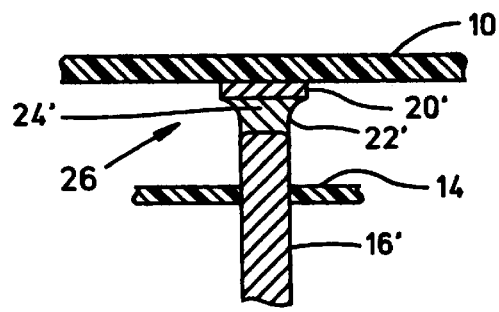
FIG. 3 is a greatly enlarged vertical cross-sectional view of a defective alternate butt joint solder connection between the upper end of one of the pins of the pin grid array of FIG. 1 and a conductive pad on the underside of the multi-chip module board. This defective solder connection arises, for example, due to lack of co-planarity.

The carrier board 32 (FIG. 5) is made of the same material as the board 10. Therefore, there is no differential in their coefficients of thermal expansion that might induce shear or other stresses in the solder connection 40 that could lead to fractures and shorts. Because of the relatively large height and volume of re-solidified solder ball 38 between the pad 42 and the head 34a of the pin 34, any induced stresses are more likely to be accommodated by the solder ball 38 than in the fillet connections 18 and 26 (FIGS. 2 and 3). Because the solder connection 40 is generally spherical it extends beyond the periphery of the conductive pad 42 thereby eliminating the need for an excessively large conductive pad area where board area is often at a premium. The shafts 34b (FIG. 5) of the pins 34 can be straightened, if necessary, without risking fractures in the solder connections 40.

FIG. 6 is a diagrammatic vertical sectional view of an alternate embodiment of our invention in which the upper side of the carrier board 44 is formed with counterbored holes 46 to confine and hold the pin head 34a and modified solder ball 48. The diameter of the hole 46 is slightly smaller than the outside diameter of the pin head 34a for a snug fit, and is significantly larger than the diameter of the hole 50 through which the shaft 34b of the pin extends in snug fashion. The top surface of the pin head 34a is recessed below the upperside of the carrier board 44. When the solder ball 48 is melted a lower cylindrical portion of the solder ball is formed which sits in the cup shaped recess above the head 34a of the pin 34. The upper portion of the solder ball 48 is generally spherical.

FIG. 7 is a diagrammatic cross-sectional view of a coating 52 of a material, such as a resist or solder mask, on the upper side of the carrier board 32. The coating 52 prevents solder from flowing through the carrier board 32 along the shaft 34b of the pin 34. This is important because any solder from the ball 38 that flows down the shaft 34b of the pin will lessen the size of the ball 38 and/or cause unwanted solder to be deposited onto the shaft 34b. Also, the coating 52 ensures that the solder ball 38 will not flow onto the upper surface of the carrier board 32. An alternative approach is to coat the shaft 34b of each pin with a material, such as Nickel, which will inhibit the solder from flowing down the shaft 34b.

FIG. 8 is a diagrammatic view of an alternate approach to preventing the flow of molten solder under the head of the pin 34a and through the hole in the carrier board 54. The pin 34 is formed with a downwardly tapered shaft 34c to ensure a snug fit in the cylindrical hole 56 through the carrier board 32. The degree of taper of the shaft 34c is exaggerated in FIG. 8. The shaft 34c (FIG. 7) of the pin 34 could also be formed with a star cross-section, flanges or other geometrical shapes to ensure a snug fit.

Figure 9:
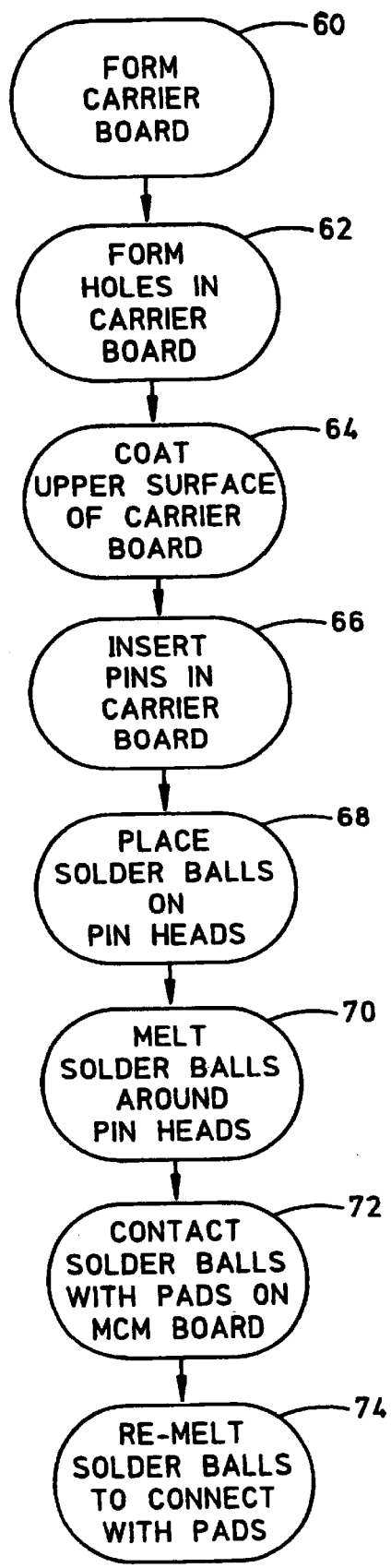
FIG. 9 is a flow diagram of the preferred embodiment of the method of the present invention.

FIG. 9 is a flow diagram of the preferred embodiment of the method of the present invention. The first step 60 of the method involves forming the carrier board 32. It may be formed of conventional FRA-4 material or other suitable material that matches that of the MCM board 10.

The second step 62 (FIG. 9) involves forming a grid of holes through the carrier board 32 such as by drilling. Where the carrier board 32 is made of a thermoplastic material, the holes can be injection molded. Substrate materials such as ceramic may have holes mechanically punched therethrough, or drilled with a laser beam.

The third step 64 (FIG. 9) of our method involves coating the upper surface of the carrier board 32 with a suitable coating 52 of a material such as a resist, solder flux or an elastomer. This will help prevent molten solder from flowing under the heads of the pins.

In the fourth step 66 (FIG. 9) of our method the shafts 34b of the pins 34 are inserted holes in the carrier board 32 to form a grid array of pins. The pins are inserted until the undersides of their heads 34a are flush with the upperside of the carrier board 32.

The fifth step 68 (FIG. 9) of our method requires the partially completed carrier board to be installed in a conventional solder ball grid array (BGA) placement machine for attachment of the solder balls 38. Suitable solder balls are commercially available from suppliers such as Alpha Metals and Indium. For high temperature applications, solder balls made of an alloy of 90% Lead and 10% Tin, for example, may be utilized. For low temperature applications, the solder balls may be made of an alloy of 63% Tin and 37% Lead, for example, that has a eutectic transition point of approximately 183 degrees C.

The conventional BGA placement machine has a pneumatic head with a grid of holes formed therein for picking up a grid of solder balls and simultaneously placing them on top of the heads 34a of each of the pins 34. The heads 34a of the pins are first coated with a suitable flux before the pre-formed solder balls 38 are placed on top of the heads 34a. The tackiness of the solder flux holds the solder balls in place until they can be melted and physically bonded to the pin heads 34a when re-solidified. The solder flux also removes the oxidation on the pins 34 and the solder balls 38 that would otherwise impair the formation of a strong solder connection 40.

According to the sixth step 70 (FIG. 9) of our method, infrared, convective or other conventional heating means are utilized to reflow the solder balls 38. When the solder al balls 38 are melted, they wrap around the side walls of their corresponding pin heads 34a, but retain their semi-spherical shape due to surface tension and other physical properties. The solder balls 38 are allowed to cool and re-solidify before the carrier board 32 is removed from the solder reflow apparatus.

According to the seventh step 72 (FIG. 9) of our method, the re-solidified solder balls 38 are placed into contact with their corresponding conductive pads 42 (FIG. 5) on the underside of the MCM board 10. Prior to such contact, the conductive pads 42 are coated with a suitable solder flux and/or solder paste.

According to the eighth and final step 74 (FIG. 9) of our method, the solder balls 38 are re-melted while they are held in physical contact with the conductive pads 42 below the same. The upper portions of the solder balls 38 bond to the conductive pads when they cool. Again, due to surface tension and other physical properties, the solder balls 38 retain their semi-spherical shape when re-melted and upon re-solidifying. The resolidified solder balls 38 align the carrier board 32 with the MCM board 10, thereby providing the required mechanical and electrical interconnection. The shafts 34b of the pins 34 can now be plugged into the socket connector 17 to interconnect the electronic components on the MCM 10 with the circuit on the mother board 12.

Referring to FIG. 10, a headless pin 76 could also be utilized in the same general configuration The use of the headless pin 76 results in a modified generally spherical solder connection 78 having many of the same advantages as the solder connection 40 of FIG. 5. In the modified solder connection 78 illustrated in FIG. 10 the solder ball 80, in its final re-solidified form, wraps around the cylindrical surface of upper end of the headless pin 76 and the vertical side walls of the conductive pad 42. The solder ball 80 also contacts and adheres to the top circular surface of the pin 76 and the horizontal lower surface of the conductive pad 42 between its side walls.

By way of further example, the solder balls 38 could first be soldered (bonded) to the conductive pads 42 on the board, allowed to cool and re-solidify and then placed over the corresponding headed or headless pins before being re-melted and soldered thereto to achieve the configuration of FIG. 5.

In the claims which follow, references to the upperside and underside of a circuit substrate or circuit board a merely for the sake of definiteness and clarify the spatial relationship of the recited components. It will be understood that either side of a substrate or circuit board can be considered the upperside or the underside simply as a point of reference.

While we have described a preferred embodiment and numerous variations of our solder ball and pin grid array electronic interconnect system and method, it should be apparent to those skilled in the art that our invention can be modified in both arrangement and detail. Therefore, the protection afforded our invention should only be limited in accordance with the scope of the following claims.

What is claimed is:

1. A method of fabricating a circuit board interconnect system, comprising the steps of:

providing a generally planar carrier board;

providing a plurality of electrically conductive pins, each pin having a head connected to a shaft, the head extending in a plurality of radial directions outward from the shaft;

inserting the shafts of the pins through the carrier board so that the heads of the pins are adjacent an upper surface of the carrier board and so that the pins are arranged in a first grid array pattern;

providing a generally planar circuit board;

forming a plurality of electrically conductive pads on a lower surface of the circuit board, there being one conductive pad corresponding to each pin and the conductive pads being arranged in a second grid array pattern complementary to the first grid array pattern;

placing a solder ball on top of each head of each pin;

melting the solder balls so that each solder ball bonds to the head of a corresponding pin;

allowing the solder balls to cool and solidify;

positioning the carrier board and the circuit board in substantially parallel relationship with the upper surface of the carrier board opposing the lower surface of the circuit board and with the carrier board and the circuit board being a sufficiently close distance apart so that each of the solder balls physically contacts a corresponding conductive pad;

re-melting the solder balls so that each solder ball bridges the close distance and bonds a corresponding conductive pad and an opposing pin head while wrapping around a side surface of the opposing pin head and retaining a substantially round shape; and allowing the solder balls to re-solidify;

whereby each of the pins is permanently mechanically and electrically connected by a rounded solder connection to the corresponding conductive pad and fractures in the rounded solder connection due to straightening of the shafts of the pins, loads being exerted on the circuit board in a lateral direction or differential thermal expansion of the carrier board and the circuit board are less likely than in a conventional butt joint solder connection.

2. The method of claim 1 wherein each of the solder balls wraps around a side surface of the corresponding conductive pad.

3. The method of claim 1 and further comprising the steps of:

providing a second circuit board;

mounting a socket connector on the second circuit board; and plugging the shafts of the pins into the socket connector.

4. The method of claim 1 and further comprising the step of coating the upper surface of the circuit board with a layer of a material that prevents weeping of solder from the solder balls underneath the heads of the pins.

5. The method of claim 1 and further comprising the steps of forming a plurality of holes in the carrier board arranged in the first grid array pattern and inserting the shafts of the pins through the holes.

6. The method of claim 1 wherein the carrier board and the circuit board are each made of materials having substantially the same coefficient of thermal expansion to minimize stresses to the interconnected carrier board and circuit board due to fluctuations in ambient temperature.

7. The method of claim 1 wherein the solder balls consist of approximately 63% tin and approximately 37% lead.

8. The method of claim 1 wherein the solder balls have a eutectic transition point of approximately one hundred and eighty-three degrees C.

9. A method, comprising:

forming an electrical conductor on a circuit board;

inserting an electrically conductive pin through a carrier board, the pin having a shaft and a head extending in a plurality of radial directions outward from the shaft;

placing a solder ball on the head of the pin;

positioning the carrier board and the circuit board in a substantially parallel relationship with one another, so that the solder ball physically contacts the conductor;

melting the solder ball, so that the solder ball bonds to the conductor and to the head of the pin, and the solder ball wraps around a side surface of the head; and solidifying the solder ball, so that the solder ball mechanically and electrically connects the head of the pin to the conductor while retaining a substantially round shape.

10. The method of claim 9 and comprising:

melting the solder ball so that the solder ball bonds to the head of the pin and allowing the solder ball to cool and solidify before contacting the solder ball with the conductor and re-melting the solder ball so that the solder ball bonds the conductor and the head of the pin.

11. The method of claim 9 wherein the solder ball wraps around a side surface of the conductor.

12. The method of claim 9 and comprising:

providing a second circuit board;

mounting a socket connector on the second circuit board; and plugging the pin into the socket connector.

13. The method of claim 9 and comprising coating the upper surface of the circuit board with a layer of a material that prevents weeping of solder from the solder ball underneath the head of the pin.

14. The method of claim 9 wherein the pin has a tapered shaft.

15. The method of claim 9 wherein the conductor is formed as a conductive pad.

16. The method of claim 9 wherein the head is positioned in a countersunk bore in the carrier board.

17. A method, comprising:

forming an electrical conductor on a circuit board;

inserting an electrically conductive pin through a carrier board, the pin having a shaft and a head extending in a plurality of radial directions outward from the shaft, the head being positioned in a countersunk bore in the carrier board;

placing a solder ball on the head of the pin;

positioning the carrier board and the circuit board in a substantially parallel relationship with one another, so that the solder ball physically contacts the conductor;

melting the solder ball, so that the solder ball bonds to the conductor and to the head of the pin; and solidifying the solder ball, so that the solder ball mechanically and electrically connects the head of the pin to the conductor while retaining a substantially round shape.

18. The method of claim 17 and further comprising:

melting the solder ball so that the solder ball bonds to the head of the pin and allowing the solder ball to cool and solidify before contacting the solder ball with the conductor and re-melting the solder ball so that the solder ball bonds the conductor and the head of the pin.

19. The method of claim 17 wherein the solder ball wraps around a side surface of the conductor.

20. A method, comprising:

forming an electrical conductor on a circuit board;

inserting an electrically conductive pin through a carrier board, the pin having a shaft and a head extending in a plurality of radial directions outward from the shaft;

placing a solder ball on the head of the pin;

positioning the carrier board and the circuit board in a substantially parallel relationship with one another, so that the solder ball physically contacts the conductor;

melting the solder ball, so that the solder ball bonds to the conductor and to the head of the pin, and the solder ball wraps around a side surface of the conductor; and solidifying the solder ball, so that the solder ball mechanically and electrically connects the head of the pin to the conductor while retaining a substantially round shape.

21. The method of claim 20 and further comprising:

melting the solder ball so that the solder ball bonds to the head of the pin and allowing the solder ball to cool and solidify before contacting the solder ball with the conductor and re-melting the solder ball so that the solder ball bonds the conductor and the head of the pin.

22. The method of claim 20 wherein the solder ball wraps around a side surface of the head.

23. The method of claim 20 and further comprising coating the upper surface of the circuit board with a layer of a material that prevents weeping of solder from the solder ball underneath the head of the pin.

* * * * *